US011459669B2

(12) United States Patent
Kindaichi et al.

(10) Patent No.: US 11,459,669 B2
(45) Date of Patent: Oct. 4, 2022

(54) SIC INGOT AND METHOD OF MANUFACTURING SIC INGOT

(71) Applicant: SHOWA DENKO K.K., Tokyo (JP)

(72) Inventors: Rimpei Kindaichi, Chiba (JP); Yohei Fujikawa, Hikone (JP); Yoshishige Okuno, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 101 days.

(21) Appl. No.: 16/223,185

(22) Filed: Dec. 18, 2018

(65) Prior Publication Data
US 2019/0194822 A1 Jun. 27, 2019

(30) Foreign Application Priority Data
Dec. 22, 2017 (JP) .............................. JP2017-246784

(51) Int. Cl.
C30B 21/02 (2006.01)
C30B 29/36 (2006.01)
C30B 29/60 (2006.01)
C30B 23/02 (2006.01)
C30B 23/00 (2006.01)
H01L 21/02 (2006.01)

(52) U.S. Cl.
CPC .............. *C30B 29/36* (2013.01); *C30B 21/02* (2013.01); *C30B 23/002* (2013.01); *C30B 23/02* (2013.01); *C30B 29/605* (2013.01); *H01L 21/02378* (2013.01); *H01L 21/02433* (2013.01)

(58) Field of Classification Search
CPC .......... C30B 21/02; C30B 21/05; C30B 21/10
See application file for complete search history.

(56) References Cited

U.S. PATENT DOCUMENTS

| 5,964,943 A | * | 10/1999 | Stein | C30B 29/36 117/88 |
| 6,780,243 B1 | * | 8/2004 | Wang | C30B 23/00 117/105 |
| 2010/0031877 A1 | * | 2/2010 | Gupta | C30B 23/002 117/105 |
| 2014/0220296 A1 | | 8/2014 | Loboda et al. | |
| 2016/0189956 A1 | * | 6/2016 | Hansen | C30B 23/02 438/503 |

FOREIGN PATENT DOCUMENTS

| CN | 105189835 A | 12/2015 |
| CN | 105531407 A | 4/2016 |
| JP | 2003-104799 A | 4/2003 |
| JP | 2006-248825 A | 9/2006 |

(Continued)

OTHER PUBLICATIONS

Communication dated Aug. 7, 2020, from The China National Intellectual Property Administration in Application No. 201811539291.6.

(Continued)

*Primary Examiner* — Robert M Kunemund
(74) *Attorney, Agent, or Firm* — Sughrue Mion, PLLC

(57) ABSTRACT

A SiC ingot includes a core portion; and a surface layer that is formed on a plane of the core portion in a growing direction, and a coefficient of linear thermal expansion of the surface layer is smaller than a coefficient of linear thermal expansion of the core portion.

20 Claims, 4 Drawing Sheets

(56) References Cited

FOREIGN PATENT DOCUMENTS

| | | |
|---|---|---|
| JP | 2007-320814 A | 12/2007 |
| JP | 2015-003850 A | 1/2015 |

OTHER PUBLICATIONS

Office Action dated Dec. 14, 2020 from the China National Intellectual Property Administration in CN Application No. 201811539291.6.

Communication dated Jun. 1, 2021, from the Japanese patent Office in application No. 2017-246784.

\* cited by examiner

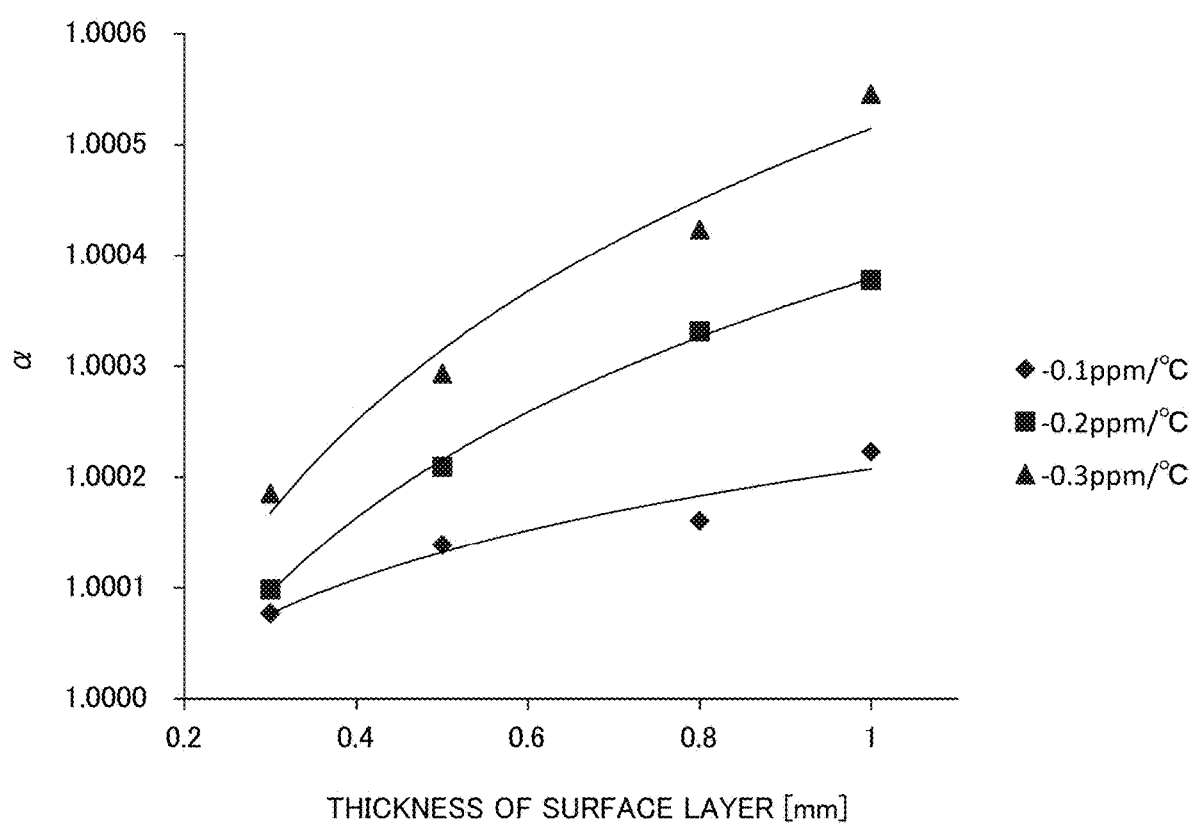

SIC INGOT AND METHOD OF MANUFACTURING SIC INGOT

BACKGROUND OF THE INVENTION

Field of the Invention

The present invention relates to a SiC ingot and a method of manufacturing a SiC ingot.

Priority is claimed on Japanese Patent Application No. 2017-246784, filed on Dec. 22, 2017, the content of which is incorporated herein by reference.

Description of Related Art

Silicon carbide (SiC) has a higher electric breakdown field than that of silicon (Si) by one order and has a greater band gap by three times. Also, silicon carbide (SiC) has properties such as higher thermal conductivity than that of silicon (Si) by about three times. Applications of silicon carbide (SiC) to a power device, a high-frequency device, a high-temperature operation device, and the like have been expected.

A SiC epitaxial wafer obtained by forming an epitaxial layer on a SiC wafer is used as a device such as a semiconductor. The epitaxial layer provided on the SiC wafer by chemical vapor deposition (CVD) serves as an active region of the SiC semiconductor device. The SiC wafer is obtained by working a SiC ingot.

The SiC ingot is obtained by performing a method such as sublimation recrystallization to promote crystal growth of a seed crystal. Patent Document 1 describes a SiC ingot with low concentration of nitrogen on the plane. Patent Document 1 describes that it is possible to suppress occurrence of cracking by optimizing stress of the single crystal and the surface layer.

Patent Document 2 describes a SiC ingot that has a dissimilar element containing layer therein. It describes that it is possible to control polytypes of the SiC single crystal by providing the dissimilar element containing layer.

PRIOR ART DOCUMENTS

Patent Documents

Patent Document 1: Japanese Unexamined Patent Application, First Publication No. 2006-248825
Patent Document 2: Japanese Unexamined Patent Application, First Publication No. 2003-104799

SUMMARY OF THE INVENTION

Basal plane dislocation (BPD) is one of killer defects of the SiC wafer. A part of BPD of the SiC wafer is also taken over to the SiC epitaxial wafer and becomes a factor of degradation of forward characteristics when a current is caused to flow forward in the device. BPD is a defect that is considered to be caused due to slipping occurring in the basal plane as one of factors thereof. The BPD of the SiC ingots according to Patent Document 1 and J Patent Document 2 is not sufficiently suppressed.

The present invention was made in view of the aforementioned problems, and an object thereof is to provide a SiC ingot with alleviated anisotropy in a bending direction of an atom alignment plane and the SiC ingot produced by the manufacturing method.

As described above, BPD is caused due to slipping occurring in the basal plane as one of factors. In order to suppress occurrence of BPD, not applying unbearable stress to an atom alignment plane (lattice plane) is important. Thus, a method capable of controlling stress applied to the SiC ingot has been discovered as a result of intensive studies. It has been discovered that anisotropy of the atom alignment plane in the bending direction can be alleviated by controlling the stress applied to the SiC ingot. That is, the present invention provides the following mechanisms to solve the aforementioned problems.

(1) A SiC ingot according to a first aspect includes: a core portion; and a surface layer that is formed on a plane of the core portion in a growing direction, and a coefficient of linear thermal expansion of the surface layer is smaller than a coefficient of linear thermal expansion of the core portion.

The ingot according to the first aspect described above in (1) preferably includes the following features. It is also preferable to combine the following features with each other.

(2) In the SiC ingot according to the aforementioned aspect, the coefficient of linear thermal expansion of the surface layer may be smaller than the coefficient of linear thermal expansion of the core portion by 0.1 ppm/° C. or more.

(3) In the SiC ingot according to the aforementioned aspect, the surface layer may have concentration of dopant which is higher than that of the core portion.

(4) In the SiC ingot according to the aforementioned aspect, the surface layer may have concentration of dopant which is 1.5 times or more as high as that of the core portion.

(5) In the SiC ingot according to the aforementioned aspect, an element may be doped in the surface layer and the core portion and the element may be nitrogen or aluminum.

(6) In the SiC ingot according to the aforementioned aspect, a thickness of the surface layer may be 0.3 mm or more.

(7) A method of manufacturing a SiC ingot according to a second aspect includes: a first step of causing a single crystal that becomes a core portion to grow in one plane of a seed crystal; a second step of causing a surface layer to grow in a plane of the core portion on a side opposite to the seed crystal in an atmosphere with higher concentration of dopant gas than that in the first step; and a third step of cooling a produced SiC ingot after the second step.

(8) The SiC ingot obtained through the third step includes a core portion, and a surface layer that is formed on a plane of the core portion in a growing direction, and a coefficient of linear thermal expansion of the surface layer is smaller than a coefficient of linear thermal expansion of the core portion.

(9) In the first step, raw materials of the SiC ingot are heated to a temperature of 2400° C. to 2600° C., and argon gas or both argon gas and dopant gas are supplied, and in the second step, both argon gas and dopant gas are supplied.

According to the method of manufacturing a SiC single crystal of the aforementioned aspect, a bending direction of an atom alignment plane becomes isotropic. The isotropic bending direction of the atom alignment plane can lead to a decrease in density of BPD.

BRIEF DESCRIPTION OF THE DRAWINGS

FIG. 7 is a graph showing a result of obtaining a change in a degree of contraction of an outer peripheral portion relative to a center portion in a case in which a thickness of a surface layer of a SiC ingot and a difference of a linear expansion rate of the surface layer from a linear expansion rate of a core portion are changed.

DETAILED DESCRIPTION OF THE INVENTION

Figure 1:
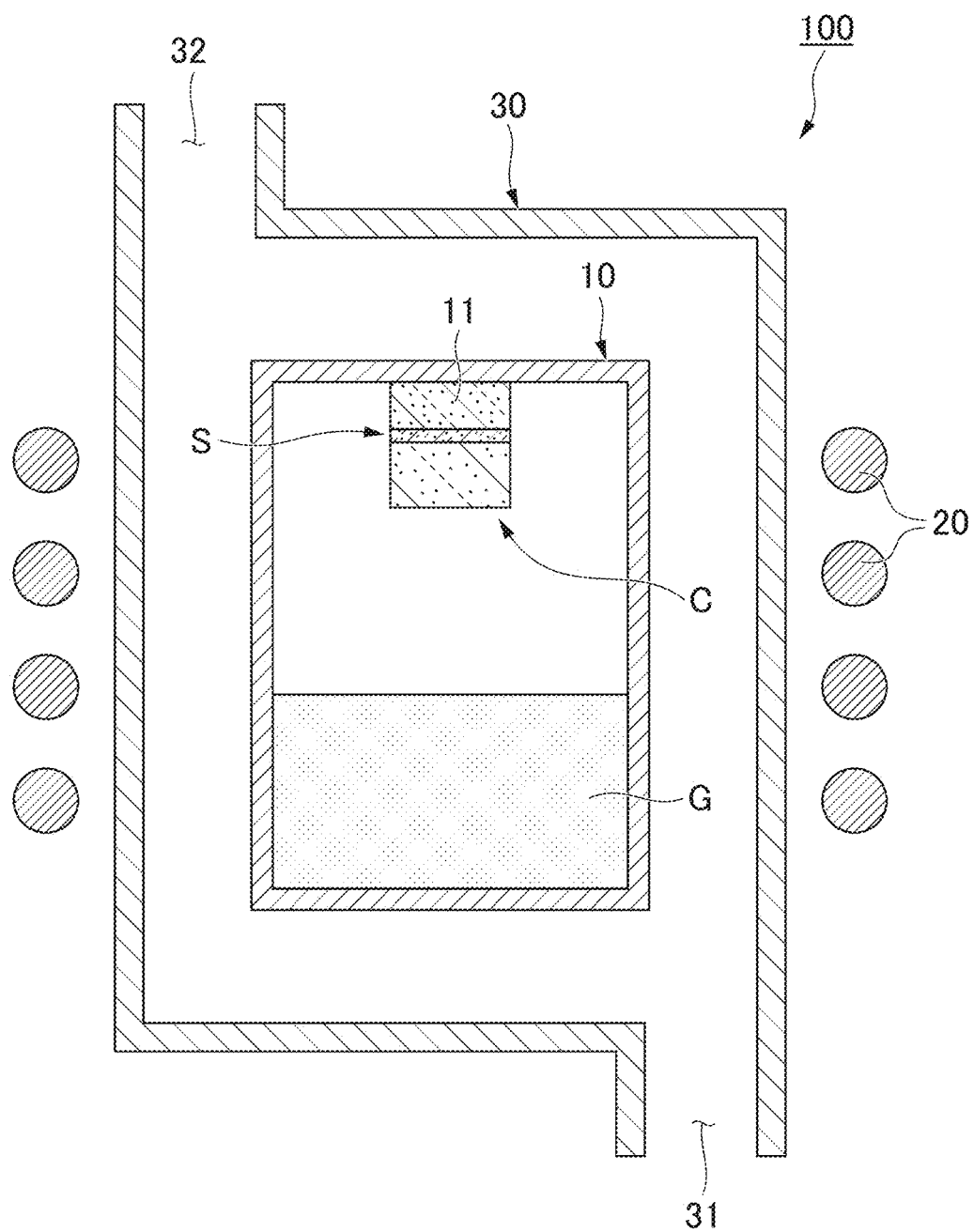
FIG. 1 is an outline schematic sectional view of a manufacturing apparatus of a SiC ingot according to an embodiment.

Hereinafter an embodiment will be described in detail appropriately with reference to drawings. In the drawings used in the following description, a characteristic part may be shown in an enlarged manner for convenience, dimensions, ratios and the like of the respective components may be the same as or different from actual dimensions, ratios and the like. The materials, the dimensions, the ratios, the values, and the like shown in the following description may be just examples, and the present invention is not limited thereto and can be performed by appropriately changing them without departing from the scope of the invention.

A method of manufacturing a SiC ingot according to a preferred embodiment of the invention is roughly classified into three steps, namely a first step, a second step, and a third step. In the first step, a single crystal that serves as a core portion is made to grow on a seed crystal. In the second step, a surface layer is made to grow in one plane of the single crystal. Finally, in the third step, the produced SiC ingot is cooled. Hereinafter, preferred examples of the respective steps will be specifically described.

FIG. 1 is a schematic sectional view of a manufacturing apparatus that can be preferably used in the method of manufacturing a SiC ingot according to the embodiment. FIG. 1 shows a raw material G, a seed crystal S, and a single crystal C all together in FIG. 1 for easy understanding. A manufacturing apparatus 100 of the SiC ingot shown in FIG. 1 includes a crucible 10, a coil 20, and a chamber 30.

The crucible 10 has a space therein. An inner bottom plane of the crucible 10 is filled with the raw material G. A seat 11 is mounted at a position that faces the raw material G with which the crucible 10 is filled. The seat 11 is a part at which the seed crystal S is mounted. For example, the seat 11 cylindrically projects toward the raw material G at a center position when viewed from the side of the raw material G A carbon material such as graphite, for example, can be used for the seat 11.

The outer periphery of the crucible 10 is covered with the coil 20. If a current is distributed inside the coil 20, the coil heats the crucible 10

The periphery of the crucible 10 is covered with the chamber 30. The chamber 30 includes a gas inlet port 31 and a gas discharge port 32. The gas inlet port 31 supplies argon gas, dopant gas, and the like into the chamber 30. The gas discharge port 32 discharges such gas from the inside of the chamber 30. A material capable of maintaining a high degree of vacuum, such as quartz or stainless steel, can be used for the chamber 30.

A preferred example of the method of manufacturing a SiC ingot will be specifically described using the manufacturing apparatus 100 shown in FIG. 1.

In the first step, the single crystal C that serves as a core portion is made to grow on the seed crystal S. The single crystal C can be produced by using a known sublimation method or the like. Gas inside the chamber 30 is discharged from the gas discharge port 32, and argon gas is supplied from the gas inlet port 31 into the chamber. At the same time, a current is caused to flow through the coil 20. The coil 20 heats the crucible 10. Heating conditions can be arbitrarily selected. A temperature gradient is formed from the raw material G toward the seed crystal S in the crucible 10. The temperature of the raw material G in the crucible 10 increases to about 2400° C. to 2600° C. by the heating. Sublimation gas sublimated from the raw material G is recrystallized on the plane of the seed crystal S in accordance with the temperature gradient, and the single crystal C is thus obtained. The dopant gas may be supplied from the gas inlet port 31 at the same time when the single crystal C is made to grow. If nitrogen gas is supplied from the gas inlet port 31, for example, a part of the nitrogen gas enters the crucible 10 and is taken into the single crystal C. In this case, the single crystal C becomes an n-type SiC ingot.

In the first step, the amount of dopant gas can arbitrarily be selected in a case in which the argon gas contains dopant gas. For example, concentration of the dopant gas in the argon gas may be 0.1 to 35% or may be 1 to 20%, for example.

Then, in the second step, a surface layer is formed on the plane of the single crystal C on the side of the raw material G The surface layer is obtained, for example, by supplying dopant gas in the second step in a case in which the dopant gas has not been supplied in the first step, or alternatively, the surface layer is obtained by increasing the concentration of the dopant gas inside the chamber 30 in the second step in a case in which the dopant gas has been supplied in the first step. If the concentration of the dopant gas inside the chamber 30 is increased, the amount of gas entering the crucible 10 increases, and the amount of dopant taken into the crystal increases. The heating temperature in the second step may be the same as the heating temperature in the first step. Although the time of the second step can arbitrarily be selected, the time may be 1 to 100 hours or may be 5 to 80 hours, for example. The heating time in the second step may be 1 to 50%, 2 to 40%, or the like of the total growth time in both the first step and the second step.

A dopant element to be added to the surface layer is arbitrary selected, and for example, nitrogen, boron, aluminum, or the like can be used. In a case in which the dopant element is nitrogen, the concentration of the dopant can be adjusted by controlling the amount of gas. In a case in which the dopant element is aluminum, aluminum is introduced as a solid raw material into the crucible 10. Therefore, causing the distance between aluminum and the single crystal C to vary is exemplified as adjustment of the concentration of the dopant. For example, a movable portion that is movable in the upper-lower direction is provided at the center of the raw material G, and aluminum is mounted on the movable portion.

In the second step, the amount of the dopant gas can arbitrarily be selected. For example, the concentration of the dopant gas in the argon gas may be 20 to 100% or 30 to 80%. Also, the concentration of the dopant gas in the second step may be 1.2 to 20 times or 2 to 10 times as high as the concentration of the dopant gas in the first step. Note that a difference between the first step and the second step may be only the concentration of the dopant gas.

Finally, in the third step, the single crystal C with the surface layer formed thereon is cooled. The cooling is performed by stopping the current flow to the coil 20. The temperature of the crucible 10 when current flows to the coil 20 exceeds 2000° C. Therefore, the single crystal C in the crucible 10 is cooled merely by stopping the current flow.

Figure 2:
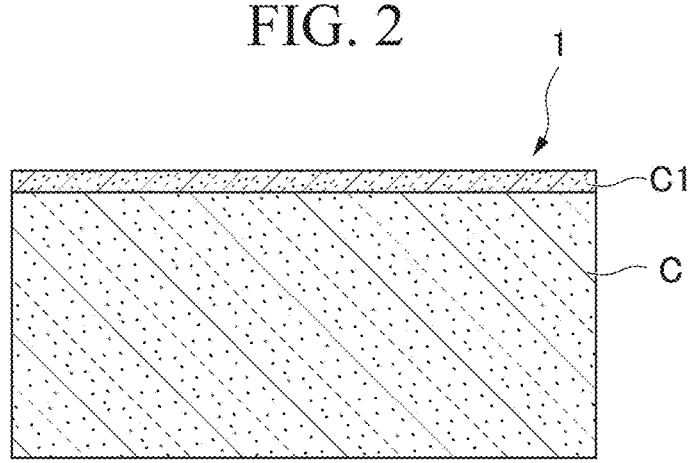
FIG. 2 is a schematic sectional view showing a preferred example of a SiC ingot with a surface layer formed thereon.

FIG. 2 is a schematic sectional view of the SiC ingot with the surface layer formed thereon. The upper direction corresponds to a crystal growing direction in HG 2, and the upper-lower direction is reversed from that of the single crystal C in FIG. 1. The SiC ingot 1 includes the core portion C (single crystal C) and a surface layer C1. The polytypes of the core portion C and the surface layer C1 are the same and are preferably 4H, that is, 4H—SiC.

The concentration of the dopant in the surface layer C1 is higher than that in the core portion C. The surface layer C1 with high concentration of the dopant has a smaller coefficient of linear thermal expansion than that of the core portion C. In the SiC ingot 1 including the surface layer C1 with the small coefficient of linear thermal expansion, the outer periphery contracts with priority during the cooling (third step).

Figure 3:
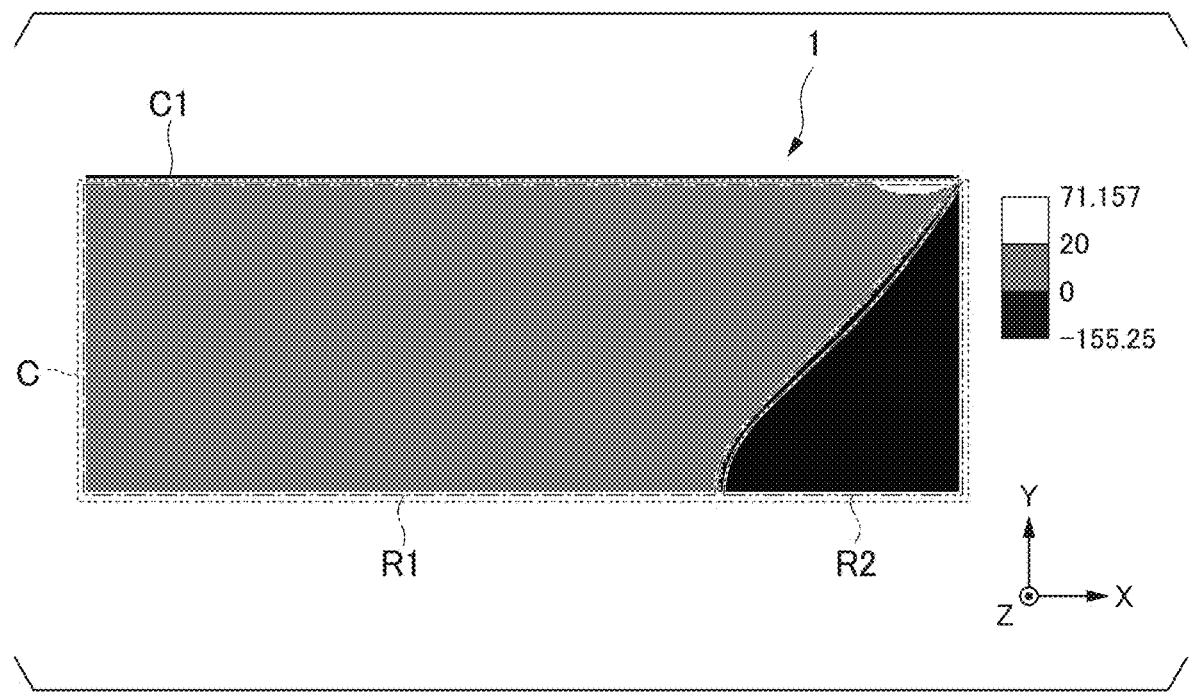
FIG. 3 is a diagram showing a simulation result of stress distribution in a diameter direction of a SiC ingot with a surface layer.

FIG. 3 is a result of simulating stress distribution in the SiC ingot with the surface layer in the diameter direction. In FIG. 3, the y direction corresponds to the crystal growing direction, and the left end corresponds to the center of the SiC ingot. The x direction corresponds to the diameter direction. The result shown in FIG. 3 was calculated by a finite element method using ANSYS Mechanical (software manufactured by ANSYS). The diameter and the height of the core portion C of the SiC ingot were set to 160 mm and 30 mm, respectively, and the thickness of the surface layer C1 was set to 1 mm. Then, vertical stress (MPa) applied in the x direction was obtained on the assumption that the SiC ingot was cooled from 2000° C. to the room temperature. The temperature in the SiC ingot before the cooling was assumed to be uniform in the x direction. The stress distribution diagram was produced on the basis of this result. The simulation was performed on the assumption that there was no difference between temperatures at the center and the outer peripheral portion of the SiC ingot. The difference between temperatures at the center and at the outer peripheral portion is a difference between temperatures at the center of the ingot and at the outer peripheral end of the ingot.

In the third step of cooling the ingot, the cooling is performed such that no difference between temperatures at the outer peripheral portion and at the center is formed in order to suppress occurrence of cracking. Not forming the difference between the temperatures means setting the difference between the temperatures at the center and at the outer peripheral portion to be ±20° C. or less. In the third step, the temperature at the center preferably not increase to a temperature that is higher than the temperature at the outer peripheral portion, and the difference of the temperature at the outer peripheral portion relative to the temperature at the center is preferably 0° C. or more. Also, the difference of the temperature at the outer peripheral portion relative to the temperature at the center is preferably 20° C. or less, is more preferably 10° C. or less, and is further preferably 5° C. or less. If the difference between the temperatures at the center portion and at the outer peripheral portion is large during the cooling, an influence of the difference between the temperatures is applied, and stress applied to the respective parts becomes complicated.

As shown in FIG. 3, compression stress is applied to the surface layer C1 with the small coefficient of linear thermal expansion. Tensile stress is applied to the most part (the region R1 surrounded by the one-dotted chain line in the drawing) of the core portion C in a repelling fashion. Meanwhile, compression stress is applied to the outer peripheral portion (the region R2 surrounded by the two-dotted chain line in the drawing) of the core portion C. That is, contraction of the center of the SiC ingot 1 is prevented by the influence of the surface layer C1 (tensile stress is applied). On the other hand, the outer peripheral portion of the SiC ingot 1 is not significantly influenced by the surface layer C1 preventing contraction, and the outer peripheral portion contracts (compression stress is applied).

If the tensile stress is generated at the center of the SiC ingot 1, and the compression stress is generated at the outer peripheral portion during the cooling, the outer peripheral portion of the SiC ingot 1 relatively contracts as compared with the center. If the outer peripheral portion of the SiC ingot 1 relatively contracts as compared with the center during the cooling, the bending direction of the atom alignment plane becomes isotropic. The reason will be described below.

Figure 4:
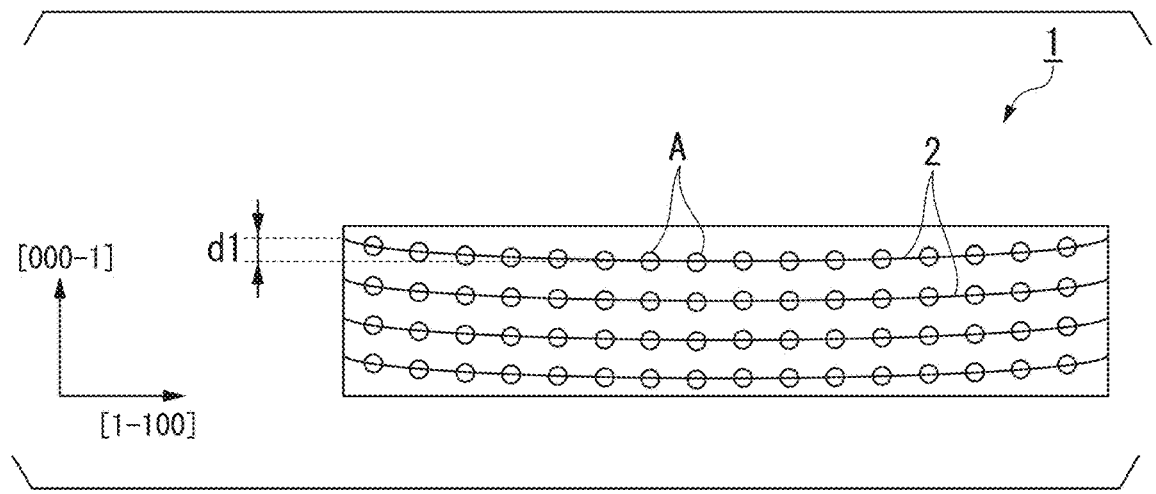
FIG. 4 is a schematic view of a cut plane of a SiC ingot cut along a straight line extending in a first direction that passes through a center of a plan view.

First, the atom alignment plane will be described. FIG. 4 is a schematic diagram of a cut plane of the SiC ingot 1 along a straight line extending in a first direction that passes through the center of the SiC ingot 1 in a plane view. In FIG. 4, the first direction is represented as [1-100]. As shown in FIG. 4, the atom alignment plane 2 in which a plurality of atoms A are aligned is formed if the cut plane of the SiC single crystal is viewed in a micro scale. In FIG. 4, the atom alignment plane 2 in the cut line is expressed by lines that are obtained by connecting the atoms A aligned along the cut plane and that extend in a direction that is substantially parallel to the cutting direction.

Figure 5:
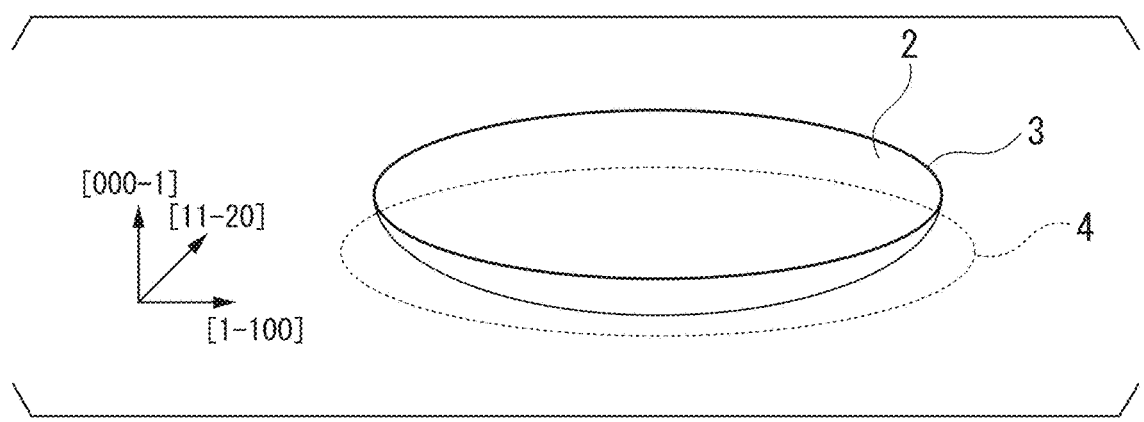
FIG. 5 is a diagram schematically showing a shape of an atom alignment plane.
Figure 6:
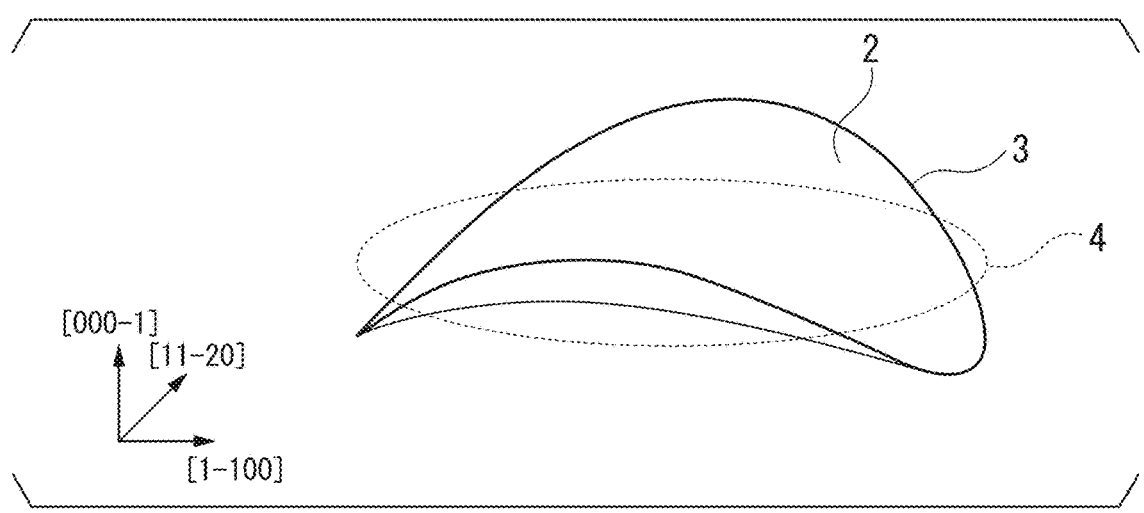
FIG. 6 is a diagram schematically showing a shape of an atom alignment plane.

There is a case in which the shape of the atom alignment plane 2 differs depending on a direction of the cut plane regardless of the surface shape of the SiC ingot 1. FIGS. 5 and 6 are diagrams schematically showing shapes of the atom alignment plane 2.

In regard to the atom alignment plane 2 shown in FIG. 5, the bending directions of the atom alignment plane 2 in the [1-100] direction and in the [11-20] direction that perpendicularly intersects the [1-100] direction conform to each other, and the bending direction of the atom alignment plane is isotropic.

Meanwhile, the atom alignment plane 2 shown in FIG. 6 has a predetermined cut plane with a recessed shape and a different cut plane with a convex saddle shape. That is, the bending directions of the atom alignment plane 2 shown in FIG. 6 in the [1-100] direction and in the [11-20] direction that perpendicularly intersects the [1-100] direction differ from each other, and the bending direction of the atom alignment plane is anisotropic.

If the atom alignment plane in the [1-100] direction and the atom alignment plane in the [11-20] direction are bent in different directions as shown in FIG. 6, the atom alignment plane 2 is distorted. If the atom alignment plane 2 is distorted, stress is generated in a plurality of directions when a temperature change occurs, and distortion tends to occur in the atom alignment plane 2. BPD occurs due to slipping of the atoms along the atom alignment plane. The distortion of the atom alignment plane 2 is considered to induce slipping of the crystal plane and becomes a factor of BPD. Meanwhile, if the SiC single crystal 1 in which both the atom alignment plane in the [1-100] direction and the atom alignment plane in the [11-20] are bent in the same direction as shown in FIG. 5 is used, stress is uniform regardless of occurrence of a temperature change, BPD density in a crystal growing portion on the SiC single crystal 1 tends not to increase.

In other words, unbearable stress is applied to the atom alignment plane if the bending direction of the atom alignment plane is anisotropic. If the bending direction of the atom alignment plane is anisotropic, the probability that slipping of the atoms occur in various directions increases. That is, BPD is caused merely by slight stress being generated in any direction during the crystal growth.

Whether the bending direction of the atom alignment plane 2 becomes isotropic or anisotropic depends on a contraction state of the SiC ingot 1 during the cooling. In a case in which the temperature at the outer peripheral portion of the SiC ingot 1 before the cooling is higher than the temperature at the center, the outer peripheral portion relatively greatly contracts as compared with the center. The atom alignment plane 2 is distorted in a direction in which a difference between the amount of contraction at the center and the amount of contraction at the outer peripheral portion is alleviated. If the outer peripheral portion relatively greatly contracts as compared with the center, a circumference of the outer periphery 3 of the atom alignment plane 2 becomes shorter than a circumference of the prescribed circle 4 in a case in which the atom alignment plane 2 is assumed to be flat (see FIG. 5). That is, the atom alignment plane 2 is isotropically bent relative to the prescribed circle 4 in the protruded direction or recessed direction.

Meanwhile, in a case in which the temperature at the center of the SiC ingot 1 before the cooling is higher than the temperature at the outer peripheral portion, the center relatively greatly contracts as compared with the outer peripheral portion. The atom alignment plane 2 is distorted in a direction in which a difference between the amount of contraction at the center and the amount of contraction at the outer peripheral portion is alleviated. If the center relatively greatly contracts as compared with the outer peripheral portion, the circumference of the outer periphery 3 of the atom alignment plane 2 becomes longer than the circumference of the prescribed circle 4 in a case in which the atom alignment plane 2 is assumed to be flat (see FIG. 6). That is, the atom alignment plane 2 is bent with anisotropy relative to the prescribed circle 4.

As described above, the outer peripheral portion relatively contracts as compared with the center since the SiC ingot 1 according to the embodiment includes the surface layer C1. That is, if the surface layer C1 is present, stress is applied in a direction in which the atom alignment plane 2 is isotropically bent. That is, the anisotropy of the atom alignment plane 2 in the bending direction is alleviated even in a case in which the temperature at the center of the SiC ingot 1 before the cooling is higher than the temperature at the outer peripheral portion.

FIG. 7 is a result of obtaining a change in a degree of contraction at the outer peripheral portion relative to the center in a case in which the thickness of the surface layer C1 of the SiC ingot 1 and a difference of the linear expansion rate of the surface layer relative to the linear expansion rate of the core portion C are changed. The result in FIG. 7 was calculated by a finite element method using ANSYS Mechanical. Conditions of the examination were set to be similar to those employed when the stress distribution was calculated as shown in FIG. 3.

The horizontal axis in FIG. 7 represents the thickness of the surface layer C1. α represented by the vertical axis in FIG. 7 is an index of a degree of contraction at the outer peripheral portion relative to the center. In a case in which stress is not generated in the SiC ingot 1, α becomes 1. The outer peripheral portion relatively contracts as compared with the center as α becomes greater than 1. A difference of the coefficients of linear thermal expansion (ppm/° C.) shown in FIG. 7 is a value obtained by subtracting the linear expansion rate of the surface layer C1 from the linear expansion rate of the core portion C.

α is represented by the following relational equation (1).

$$\alpha = (\Delta r_1 / r_1) / (\Delta r_2 / r_2) \quad (1)$$

Here, $\Delta r_1$ is contraction displacement at the center of the SiC ingot 1, $r_1$ is a distance between a measurement point of the center of the SiC ingot 1 and a center axis of the SiC ingot 1, $\Delta r_2$ is contraction displacement at the outer peripheral portion of the SiC ingot 1, and $r_2$ is a distance between a measurement point of the outer peripheral portion of the SiC ingot 1 and the center axis of the SiC ingot 1. In FIG. 7, the measurement point of the center was assumed to be a position of 2 mm from the center axis, and the measurement point of the outer peripheral portion was assumed to be a position of 80 mm from the center axis.

In a case in which the thickness of the surface layer C1 is the same as shown in FIG. 7, the value of α increases as the difference of the coefficients of linear thermal expansion increases. In a case in which the coefficients of linear thermal expansion are the same, the value of α increases as the thickness of the surface layer C1 increases. That is, anisotropy of the atom alignment plane 2 in the bending direction is further alleviated as the difference of the coefficients of linear thermal expansion is larger and the thickness of the surface layer C1 is greater.

The maximum value of the difference between the coefficients of linear thermal expansion of the surface layer C1 and of the core portion C is preferably 0.1 ppm/° C. or more and is more preferably 0.2 ppm/° C. or more in the temperature range (from the room temperature to about 2000° C.) at the time of the cooling. Note that although an upper limit value of the difference between the coefficients of linear thermal expansion of the surface layer C1 and of the core portion C can arbitrarily be selected, and for example, the upper limit may be 0.5 ppm/° C. or less, 1.0 ppm/° C. or less, or the like.

The thickness of the surface layer C1 is preferably 0.3 mm or more and is more preferably 0.5 mm or more. Note that the thickness of the surface layer C1 is an average value of results of measuring five points at equal intervals in the outer peripheral direction from the center axis of the SiC ingot 1. Note that although an upper limit value of the thickness of the surface layer C1 can arbitrarily be selected, the upper limit value may be 2 mm or less, 5 mm or less, or the like, for example.

The concentration of the dopant in the surface layer C1 is preferably 1.5 times or more as high as the concentration of the dopant in the core portion C. The aforementioned concentration ratio is further preferably 2 times or more. Note that an upper limit value of the aforementioned concentration ratio can arbitrarily be selected, the upper limit value may be 10 times or less, 20 times or less, or the like, for example.

The concentration of the dopant in the surface layer C1 is preferably $1 \times 10^{19}/cm^3$ or more, and the concentration of the dopant in the core portion C is preferably less than $1.0 \times 10^{19}/cm^3$. The concentration of the dopant in the surface layer C1 is more preferably $1.5 \times 10^{19}/cm^3$ or more. Note that although an upper limit value of the concentration of the dopant can arbitrarily be selected, the upper limit may be $1\times10^{20}/cm^3$ or less, $2.0\times10^{20}/cm^3$ or less, or the like, for example.

The concentration of the dopant in the core portion C is more preferably less than $8\times10^{18}/cm^3$. Note that although a lower limit value of the concentration of the dopant can arbitrarily be selected, the lower limit value may be $1.0\times10^{18}/cm^3$ or more, $1.0\times10^{16}/cm^3$ or more, or the like, for example.

Although the preferred embodiment of the invention has been described above in detail, the invention is not limited to a specific embodiment, and various modifications and changes can be applied without departing from the scope of the invention.

For example, although the case of the sublimation method was an exemplary example and described as the aforementioned method of manufacturing a SiC ingot, the SiC ingot may be produced by using a gas method or a solution method other than the sublimation method. In the case of the gas method, it is possible to produce the surface layer by changing the concentration of the dopant gas similarly to the sublimation method. In the case of the solution method, it is possible to produce the surface layer by increasing an atmospheric pressure.

EXAMPLES

Example 1

In order to produce a SiC ingot with a diameter of 160 mm, a seed crystal was prepared. First, amounts of bending in the atom alignment plane of the seed crystal were measured in two perpendicularly intersecting directions (the [1-100] direction and the [11-20] direction). The amount of bending d1 of the atom alignment plane is the distance between an upper end and a lower end of the atom alignment plane in the growing direction (see FIG. 4). The amount of bending of the atom alignment plane was measured by X-ray diffraction (XRD). The measured plane was decided in accordance with a measuring direction, and the measured plane satisfies a relationship of (nh mk mi n) in the measuring direction [hkil].

Then, a single crystal that served as a core portion was made to grow on the seed crystal by using an apparatus similar to the manufacturing apparatus shown in FIG. 1. Mixture gas containing 16% of nitrogen mixed in argon gas was supplied from the gas inlet port. Then, the concentration of nitrogen in the argon gas was set to 55% in the last 3% (5 hours) of the total growth time. Then, the single crystal was cooled, and a SiC ingot that had a core portion with a growth amount of 30 mm and a diameter of 6 inches and a surface layer formed thereon to have a thickness of 1 mm was obtained.

The amounts of bending in the atom alignment plane of the SiC ingot were measured in two perpendicularly intersecting directions (the [1-100] direction and the [11-20] direction). The difference between the amount of bending in a first direction and the amount of bending in a second direction was 14 μm. The difference of the amounts of bending was smaller than the result of performing the measurement in the seed crystal by 7 μm. That is, the anisotropy of the atom alignment plane in the bending direction decreased.

Comparative Example 1

Although a SiC ingot was also formed in Comparative Example 1, Comparative Example 1 was different from Example 1 in that the concentration of nitrogen in the argon gas was not changed in the last 5 hours of the growth time. That is, the surface layer was not formed on the plane of the core portion.

Then, the amounts of bending in the atom alignment plane of the SiC ingot were measured in the two perpendicularly intersecting directions (the [1-100] direction and the [11-20] direction) similarly to Example 1. The difference between the amount of bending in the first direction and the amount of bending in the second direction was 33 μm. The difference between these amounts of bending was greater than the result of performing measurement in the seed crystal by 15 μm. That is, the anisotropy of the atom alignment plane in the bending direction increased.

The ingots obtained in Example 1 and Comparative Example 1 were sliced and subjected to substrate working. Molten KOH etching was performed on the substrates acquired from the respective ingots, and density of dislocation was measured. The number density of BPD was $520/cm^2$ for the substrate in Example 1, and the number density of BPD was $1665/cm^2$ for the substrate in Comparative Example 1.

It was confirmed that it was possible to provide a SiC ingot in which anisotropy of the atom alignment plane in the bending direction was alleviated and a manufacturing method thereof by the invention.

EXPLANATION OF REFERENCES

1: SiC ingot
2: Atom alignment plane
3: Outer periphery
4: Prescribed circle
10: Crucible
11: Seat
20: Coil
30: Chamber
31: Gas inlet port
32: Gas discharge port
100: Manufacturing apparatus
A: Atom
C: Single crystal
C1: Surface layer
d1: Amount of bending
S: Seed crystal
G: Raw material
R1, R2: Region

The invention claimed is:
1. A SiC ingot consisting of:
a core portion; and
a surface layer that is formed on a plane of the core portion in a growing direction,
wherein the SiC ingot consists of the core portion and the surface layer immediately after crystal growth,
wherein a coefficient of linear thermal expansion of the surface layer is smaller than a coefficient of linear thermal expansion of the core portion,
the surface layer is the topmost layer of the SiC ingot,
the surface layer has a concentration of dopant, which is 1.5 times or more as high as a concentration of dopant of the core portion, and
a thickness of the surface layer is 0.3 mm or more and is smaller than that of the core portion.
2. The SiC ingot according to claim 1, wherein the coefficient of linear thermal expansion of the surface layer is smaller than the coefficient of linear thermal expansion of the core portion by 0.1 ppm/° C. or more.

3. The SiC ingot according to claim 1, wherein an element is doped in the surface layer and the core portion, and the element is nitrogen or aluminum.

4. A method of manufacturing a SiC ingot comprising:
a first step of causing a single crystal that becomes a core portion to grow in one plane of a seed crystal;
a second step of causing a surface layer to grow in a plane of the core portion on a side opposite to the seed crystal in an atmosphere with higher concentration of dopant gas than that in the first step; and
a third step of cooling a produced SiC ingot after the second step,
wherein the surface layer is the topmost layer of the SiC ingot,
the surface layer has a concentration of dopant, which is 1.5 times or more as high as a concentration of dopant of the core portion, and
the first step, the second step and the third steps are performed one and not more than one time respectively.

5. The method of manufacturing a SiC ingot according to claim 4,
wherein the SiC ingot obtained through the third step includes
a core portion, and
a surface layer that is formed on a plane of the core portion in a growing direction, and
wherein a coefficient of linear thermal expansion of the surface layer is smaller than a coefficient of linear thermal expansion of the core portion.

6. The method of manufacturing a SiC ingot according to claim 5,
wherein in the first step, raw materials of the SiC ingot are heated to a temperature of 2400° C. to 2600° C., and argon gas or both argon gas and dopant gas are supplied, and
wherein in the second step, both argon gas and dopant gas are supplied.

7. The method of manufacturing a SiC ingot according to claim 4,
wherein dopant gas is not supplied in the first step.

8. The method of manufacturing a SiC ingot according to claim 4,
wherein dopant gas is supplied in the first step.

9. The method of manufacturing a SiC ingot according to claim 4,
wherein, in the third step, temperature difference between temperature at a center of the ingot and temperature at an outer peripheral portion of the ingot is controlled to be +20° C. or less.

10. The method of manufacturing a SiC ingot according to claim 9,
wherein, in the third step, the temperature at the center of the ingot is controlled to be less than or equal to the temperature at the outer peripheral portion of the ingot.

11. The method of manufacturing a SiC ingot according to claim 5,
wherein the coefficient of linear thermal expansion of the surface layer is smaller than the coefficient of linear thermal expansion of the core portion by 0.1 ppm/° C. or more.

12. The method of manufacturing a SiC ingot according to claim 5,
wherein an element is doped in the surface layer and the core portion, and the element is nitrogen or aluminum.

13. The method of manufacturing a SiC ingot according to claim 5,
wherein a thickness of the surface layer is 0.3 mm or more.

14. The SiC ingot according to claim 1, wherein
the surface layer has the concentration of dopant, which is 2 times or more than the concentration of dopant of the core portion, and
the surface layer is formed under fixed conditions.

15. The SiC ingot according to claim 1, wherein the surface layer is formed directly on the core portion.

16. The method of manufacturing a SiC ingot according to claim 4,
wherein the surface layer has the concentration of dopant which is 2 times or more than the concentration of dopant of the core portion.

17. The method of manufacturing a SiC ingot according to claim 4,
wherein the surface layer is formed directly on the core portion.

18. The method of manufacturing a SiC ingot according to claim 4,
wherein the first step is performed under fixed conditions, and
the second step is performed under fixed conditions.

19. The method of manufacturing a SiC ingot according to claim 4,
wherein the first step and the second step are performed at same temperature.

20. A SiC ingot is-manufactured by the method according to claim 4, wherein the SiC ingot consists of:
a core portion; and
a surface layer that is formed on a plane of the core portion in a growing direction,
wherein the SiC ingot consists of the core portion and the surface layer immediately after crystal growth,
wherein a coefficient of linear thermal expansion of the surface layer is smaller than a coefficient of linear thermal expansion of the core portion,
the surface layer is the topmost layer of the SiC ingot,
the surface layer has a concentration of dopant, which is 1.5 times or more as high as a concentration of dopant of the core portion, and
a thickness of the surface layer is 0.3 mm or more and is smaller than that of the core portion.

* * * * *